US010044342B2

(12) United States Patent
Peterson et al.

(10) Patent No.: US 10,044,342 B2
(45) Date of Patent: Aug. 7, 2018

(54) DELAY LINE FOR ONE SHOT PRE-EMPHASIS

(71) Applicant: QUALCOMM Incorporated, San Diego, CA (US)

(72) Inventors: LuVerne Ray Peterson, San Diego, CA (US); Thomas Bryan, Carlsbad, CA (US); Tin Tin Wee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/178,389

(22) Filed: Jun. 9, 2016

(65) Prior Publication Data

US 2017/0359053 A1   Dec. 14, 2017

(51) Int. Cl.
| | |
|---|---|
| H03K 3/012 | (2006.01) |
| H03K 5/134 | (2014.01) |
| H03K 3/356 | (2006.01) |
| H03K 19/00 | (2006.01) |
| H04L 25/03 | (2006.01) |
| G06F 1/32 | (2006.01) |
| H03K 17/16 | (2006.01) |
| H03K 19/003 | (2006.01) |
| H03K 5/00 | (2006.01) |

(52) U.S. Cl.
CPC ............. *H03K 3/012* (2013.01); *G06F 1/32* (2013.01); *H03K 3/356113* (2013.01); *H03K 5/134* (2014.07); *H03K 17/161* (2013.01); *H03K 19/0005* (2013.01); *H03K 19/0008* (2013.01); *H03K 19/0013* (2013.01); *H03K 19/00361* (2013.01); *H04L 25/03019* (2013.01); *H03K 2005/00195* (2013.01)

(58) Field of Classification Search
CPC ......... H03K 5/134; H03K 2005/00195; H03K 3/012; H03K 3/356113; H03K 19/0013; H04L 25/03019
USPC ........ 326/26, 27, 82, 83; 327/108, 109, 111, 327/112
See application file for complete search history.

(56) References Cited

U.S. PATENT DOCUMENTS

| | | | |
|---|---|---|---|
| 5,045,722 A | 9/1991 | Yang et al. | |
| 5,414,659 A | 5/1995 | Ito | |
| 5,632,019 A | 5/1997 | Masiewicz | |
| 5,654,648 A * | 8/1997 | Medhekar | H03K 19/01707 326/17 |
| 6,130,563 A | 10/2000 | Pilling et al. | |
| 6,256,235 B1 * | 7/2001 | Lee | G11C 7/1048 327/108 |
| 6,351,172 B1 | 2/2002 | Ouyang et al. | |
| 7,538,572 B2 * | 5/2009 | Lee | H03K 19/01721 326/26 |
| 8,390,315 B1 * | 3/2013 | Wang | H03K 19/01721 326/26 |
| 2009/0267640 A1 | 10/2009 | Kuzmenka | |

(Continued)

OTHER PUBLICATIONS

International Search Report and Written Opinion—PCT/U32017/ 033853—ISA/EPO—dated Aug. 16, 2017.

*Primary Examiner* — William Hernandez
(74) *Attorney, Agent, or Firm* — Haynes and Boone, LLP (36340)

(57) ABSTRACT

A die-to-die data transmitter is disclosed with a pull-up one-shot circuit and a pull-down one-shot circuit, each forming a delay circuit that determines a variable preemphasis period.

26 Claims, 3 Drawing Sheets

(56) References Cited

U.S. PATENT DOCUMENTS

2012/0161816 A1    6/2012    Seth et al.
2014/0064404 A1    3/2014    Gonzalez

* cited by examiner

DELAY LINE FOR ONE SHOT PRE-EMPHASIS

TECHNICAL FIELD

This application relates generally to transmission of signals between integrated circuit chips over a die-to-die interface and, more specifically, to a transmitter with a one-shot circuit for preemphasis.

BACKGROUND

To provide reduced power consumption in the dynamic random access memory (DRAM) devices for the mobile market, various low power double data rate (LPDDR) DRAM standards have evolved in which the DRAM may vary the signaling voltage and data rate used to transmit data to a receiving device such as a system-on-a-chip (SOC). A communication channel extends between the SOC and the DRAM over which each bit is transmitted as either a binary high (logic one) symbol or a binary low (logic zero) symbol over the symbol interval. At higher data rates (e.g., 1-10 Giga-bits per second), the channel capacitance causes high-frequency attenuation on transmitted data, and the signal transition expands to adjacent symbol intervals. The resulting inter-symbol interference (ISI) limits the achievable data rates.

To successfully transmit high-speed data, preemphasis techniques have been developed that increase the high-frequency gain for the data transmitter. One way to provide the desired increased high-frequency gain is unit-interval-based (UI-based, referring to the symbol interval as having a unit length) preemphasis. In UI-based preemphasis, a register stores the previous bit state (e.g., logic zero or logic one) to enable the transmitter to have a lower output impedance for a unit interval after a transition (both zero-to-one and one-to-zero). The register requires a high-frequency clock that consumes power and adds to routing complications. As integrated circuit chips are often deployed in mobile devices, power savings has become a focus of interest. Die-to-die interfaces consume power, making it desirable to save power at die-to-die interfaces when possible while providing high signal integrity.

Depending upon the LPDDR protocol, a DRAM may present either a terminated or a non-terminated load to the transmitting device such as an SOC. Although the use of a non-terminated load saves power, such a load is not matched to the characteristic impedance of the channel such that each the data transitions (rising and falling edges) transmitted from the data transmitter to the DRAM may be reflected back to the data transmitter. Moreover, even if a DRAM is presenting a terminated load, it may be included within a bank or group of DRAMs that are not presenting a terminated load such that these additional non-terminated loads cause reflections. Depending upon the nature of the non-terminated load and the electrical distance of the channel, the transmission of a logic one following a logic zero (the transmission of a rising edge for a current bit) may be reflected back as a falling edge during the transmission of a subsequent bit. If the subsequent bit is also a binary one, it may be interpreted as a logical zero by the DRAM due to this interference. Similarly, a binary transition from a one to zero for a current bit may be reflected back as a rising edge during the transmission of the subsequent bit. If the subsequent bit is also a binary zero, it may be interpreted as a binary one by the DRAM due to this interference.

To fight this interference due to reflections from non-terminated loads, the preemphasis should extend beyond a unit interval. But such extended preemphasis is problematic during the transmission of alternating ones and zeros. For example, the preemphasis for a binary one transmission (if extended beyond the unit interval) would then interfere with the transmission of a subsequent binary zero bit.

Accordingly, there is a need in the art for improved lower-power pre-emphasis techniques that address the problems caused by non-terminated loads.

SUMMARY

A transmitter is provided with a preemphasis duration that matches the expected peak reflection time of a transmitted symbol to a non-terminated load on a receiving device. The transmitter may be used in a system having a positive logic convention in which a binary one is represented by charging a transmit pin or output node for the transmitter to a positive voltage during the unit interval (symbol duration) whereas a binary zero is represented by grounding the transmit pin for the symbol duration. But it will be appreciated that disclosed transmitter may be implemented in a system having a negative logic convention in which a binary one is transmitted by grounding the transmit pin for the symbol duration and in which a binary zero is transmitted by charging the transmit pin to a positive voltage for the symbol duration. The following discussion will thus be directed to a positive logic convention implementation without loss of generality.

The expected peak reflection time delay corresponds to the time of maximum interference at the transmitter from the reflected transmitted bit (transmitted symbol, either a binary zero or a binary one). The transmitter includes a one-shot pull-up circuit that responds to rising edge for the transmitted symbol (transmission of a binary one following a preceding transmission of a binary zero) by charging the output terminal for a pull-up preemphasis period that matches the expected peak reflection time delay for the transmitted symbol. The pull-up preemphasis period is determined by a pull-up delay line in the one-shot pull-up circuit. The condition of the pull-up delay line upon the termination of the pull-up preemphasis period is denoted herein as a reset. This reset occurs with a short delay that is much less than the fastest clock unit interval (UI), since the delay time for pull-up delay line could be longer than a UI. In this fashion, the one-shot pull-up circuit will not have a residual signal passing through the pull-up delay line that could interfere with the transmission of a 101 or 010 data pattern—which could result in the delay line not turning on at the appropriate time). The pull-up delay line controls the one and off state of a pull-up transistor. The pull-up transistor couples between a power supply node supplying a power supply voltage and the output terminal. In response to the rising edge for the transmitted symbol the pull-up delay line switches on the pull-up transistor to charge the output terminal to the power supply voltage. The pull-up delay line then resets upon the termination of the pull-up preemphasis period to shut off the pull-up transistor. But the pull-up delay line is configured to reset and shut off the pull-up transistor not only upon the termination of the pull-up preemphasis period but also when a subsequent symbol to be transmitted is a binary zero. In this fashion, the pull-up preemphasis period may extend beyond the symbol duration (depending upon the relationship between the data transmission rate and the expected peak reflection time delay) without hindering the transmission of the falling edge for the subsequent binary zero symbol.

The transmitter also includes a one-shot pull-down circuit that discharges the output terminal voltage for a pull-down preemphasis period that matches the expected peak reflection time delay such that the pull-down preemphasis period may equal the pull-up preemphasis period. The one-shot pull-down circuit includes a pull-down delay line that it triggered by a falling edge transmission for the current symbol (transmitting a binary zero following the transmission of a binary one) to switch on a pull-down transistor coupled between the output node and ground. The condition of the pull-down delay line upon the termination of the pull-down preemphasis period is also denoted herein as a reset. The pull-down delay line then resets upon the termination of the pull-down preemphasis period to shut off the pull-down transistor. But the pull-down delay line is configured to reset and shut off the pull-down transistor not only upon the termination of the pull-down preemphasis period but also if the subsequent symbol following the symbol that had triggered the one-shot pull-up circuit is a binary one symbol. In this fashion, the pull-down preemphasis period may extend beyond the symbol duration (depending upon the relationship between the data transmission rate and the expected peak reflection time delay) without hindering the transmission of a rising edge for the subsequent binary one symbol. The preemphasis from the transmitter thus advantageously counters the deleterious effects of reflected signals from a non-terminated load in the receiving device without extending beyond two unit intervals regardless of process, voltage, and temperature variations in the semiconductor devices comprising the transmitter. These and additional advantages may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
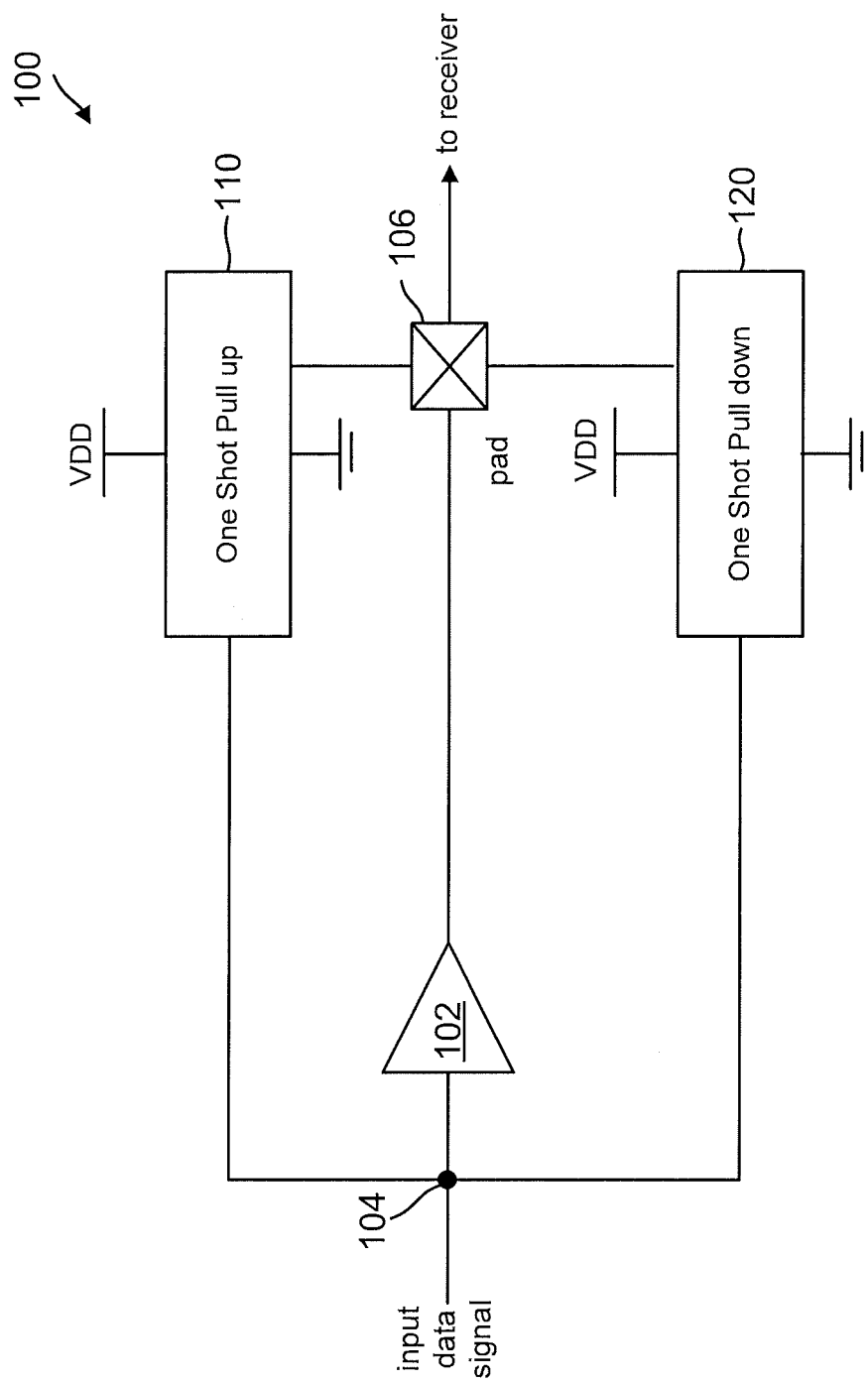
FIG. 1 is a block circuit diagram of a data transmitter in accordance an aspect of the disclosure.

To meet the need in the art for preemphasis to counter the interference caused by reflected transmitted symbols from a non-terminated load in a receiving device, a transmitter is provided that includes a one-shot pull-down circuit and a one-shot pull-up circuit. The transmitter transmits binary symbols such that each binary symbol (which may also be designated herein as a binary signal or simply a bit) extends across a symbol period (also denoted herein as a unit interval). The transmitter transmits each symbol over an output terminal for a transmitting device including the transmitter. The output terminal couples over a suitable transmission line such as a printed circuit board trace to an input terminal on the receiving device.

The one-shot pull-up circuit responds to a rising edge for the beginning of a current symbol transmission by switching on a pull-up transistor coupled between a power supply node supplying a power supply voltage and the output terminal. In particular, the one-shot pull-up circuit includes a pull-up delay line that controls the on and off state of the pull-up transistor. In response to a rising edge for the current symbol, the pull-up delay line switches on the pull-up transistor and begins timing a pull-up preemphasis period that matches the expected peak reflection time delay for a current symbol transmitted by the transmitter. This current symbol reflects from a non-terminated load at the receiving device (or from a non-terminated load at another device that couples to the transmission line) and reaches a peak value at the output terminal of the transmitter at the peak reflection time delay. Depending upon the data rate for the transmitted symbols, the peak reflection time delay may extend beyond the unit interval such that the reflection of a current symbol interferes with the transmission of a subsequent symbol. In particular, the reflected symbol may be complementary to the subsequent symbol even if the current symbol and the subsequent symbol were of the same polarity depending upon the characteristics of the non-terminated load and the electrical length of the transmission line.

The following discussion will assume that a positive logic convention is used in the transmitter such that a binary one symbol is transmitted by charging the output node to the power supply voltage for the duration of the unit interval. But it will be appreciated that a negative logic convention may be used in alternative embodiments. Suppose that a first transmitted symbol was a binary zero symbol and that a subsequent second symbol was a binary one symbol. The second symbol would thus have a rising edge at the beginning of its unit interval that would trigger the pull-up delay line to switch on the pull-up transistor and begin timing the pull-up preemphasis period. Should a subsequent third symbol be a binary one symbol, it would have no rising edge as it follows the second symbol, which was also a binary one. But the expected peak reflection time delay mirrored by the pull-up delay line may be such that the one-shot pull-up circuit is still pulling-up the output terminal during the transmission of the third symbol. In this fashion, the interference from the reflection of the second symbol is countered by the pull-up that continues during the transmission of the third symbol. The pull-up delay line resets upon the termination of the pull-up preemphasis period to switch off the pull-up transistor. But it may be the case that the third symbol to be transmitted is a binary zero symbol. The pull-up extending beyond the unit interval from the second symbol transmission would then interfere with the discharging of the output node to transmit the third symbol. The pull-up delay line is thus configured to reset should the symbol following the symbol that triggered the pull-up delay line be a binary zero symbol. The transmitter may then discharge the output terminal to transmit this binary zero symbol without interference from a pull-up preemphasis that may otherwise have extended beyond the unit interval in which the preemphasis was triggered and interfered with the transmission of the subsequent binary zero symbol (depending upon the relationship between the desired pull-up preemphasis period and the unit interval).

The transmitter includes a one-shot pull-down circuit that functions as the complement of the one-shot pull-up circuit. The one-shot pull-down circuit thus includes a pull-down delay line that controls the on and off state of a pull-down transistor coupled between the output terminal and ground. The pull-down delay line is triggered by a falling edge for the current symbol transmission (the current symbol being a binary zero following a preceding transmission of a binary one symbol) to switch on the pull-down transistor for a duration of a pull-down preemphasis period that also matches the expected peak reflection time delay. Should the triggering symbol be followed by a binary one symbol, the pull-down delay line resets to switch off the pull-down transistor regardless of whether the pull-down preemphasis period is still unfinished. In this fashion, the preemphasis from the transmitter may extend across the unit interval yet bet terminated should this extended preemphasis conflict with a subsequent symbol's transmission, Turning now to the drawings, FIG. 1 illustrates an example transmitter 100. Transmitter 100 receives a current binary symbol to be transmitted from an output driver 102 at an input data node 104. The transmitted symbol is driven by output driver 102 over an output node such an output terminal 106 to a receiving device through a transmission line (not illustrated). Transmitter 100 may be included in a transmitting device such as a system-on-a-chip whereas the receiving device may be an external DRAM that may present an un-terminated load to the transmission line.

Depending upon the binary value of the current symbol to be transmitted, output driver 102 will either charge output terminal 106 to a power supply voltage VDD or discharge output terminal to ground. To provide preemphasis to the resulting symbol transmission, transmitter 100 includes a one-shot pull-up circuit 110 that is configured to charge output terminal 106 to the power supply voltage VDD in response to a rising edge for a current symbol from output driver 102. Such a rising edge requires the current symbol to be the complement of the preceding symbol. For example, the current symbol will have such a rising edge if it is a binary one symbol and the previous symbol was a binary zero symbol in a positive logic embodiment. One-shot pull-up circuit 110 charges output terminal 106 for a pull-up preemphasis period that matches an expected peak reflection time delay from each transmitted symbol. But one-shot pull-up circuit 110 releases this pull-up should a subsequent symbol from output driver 102 be a binary zero symbol.

Figure 2:
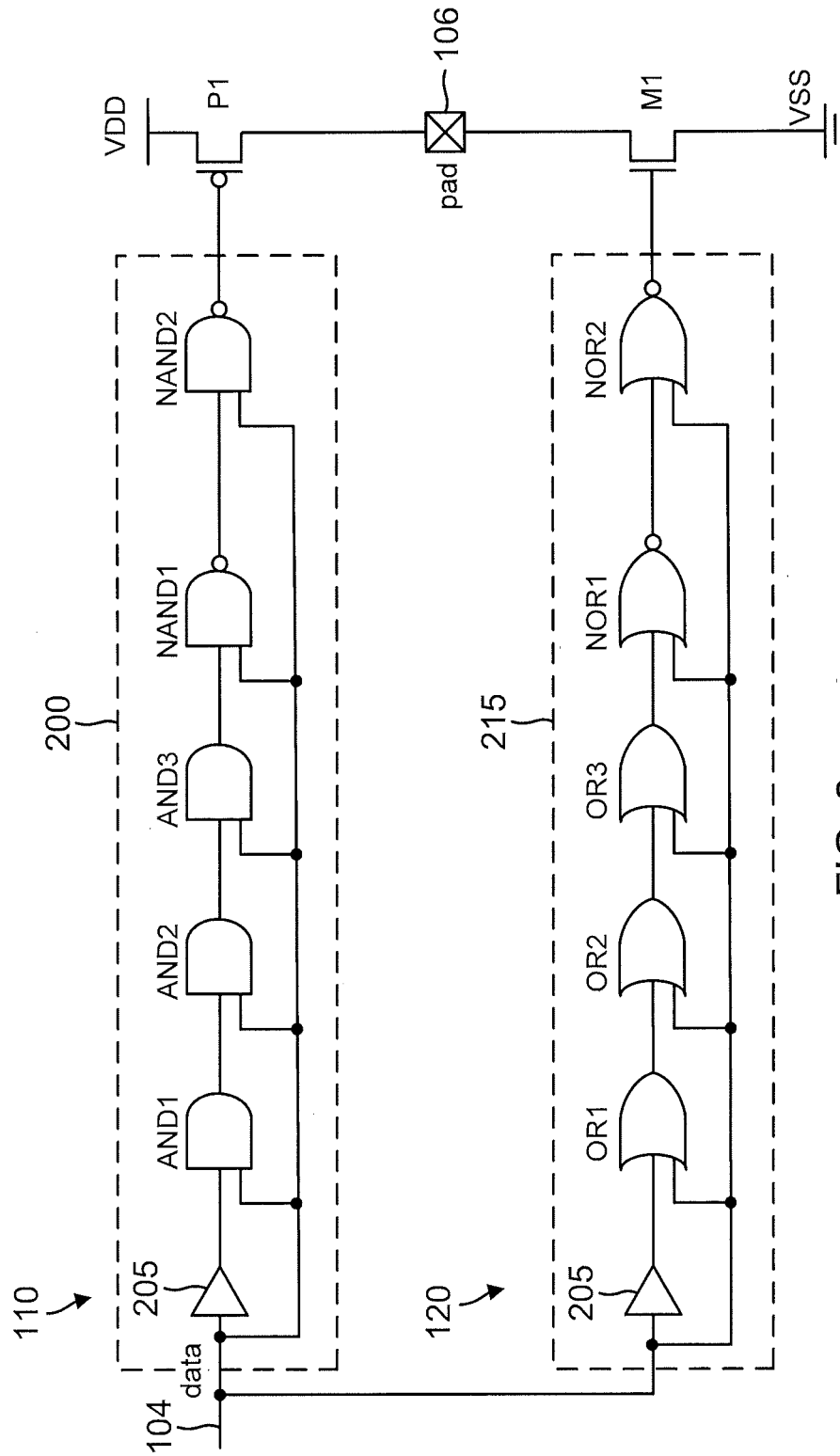
FIG. 2 is circuit diagram illustrating both a pull-up one-shot circuit and a pull-down one-shot circuit in the data transmitter of FIG. 1.

A one-shot pull-down circuit 120 functions in a complementary fashion to one-shot pull-up circuit 110 as discussed previously. The operation of one-shot pull-up circuit 110 and one-shot pull-down circuit 120 may be better understood with reference to FIG. 2. One shot pull up circuit 110 includes a pull-up delay line 200 that may include an initial buffer 205, a set of AND logic gates arranged in series from an initial AND gate AND1 to a second AND gate AND2 and finally to a third AND gate AND3. Each AND gate receives the current symbol carried on input data node 104. Initial AND gate AND1 also receives the output of buffer 205. Due to the serial coupling, second AND gate AND2 receives the output of initial AND gate AND1. Similarly, third AND gate AND3 receives the output of second AND gate AND2. The output of third AND gate AND3 is received by a first NAND gate NAND1, which also receives the current symbol as carried on input data node 104. The output of first NAND gate NAND1 drives a second NAND gate NAND2 that also receives the current binary symbol as carried on input data node 104. One-shot pull-up circuit 110 also includes a pull-up transistor such as a PMOS transistor P1 that has its source coupled to a power supply node supplying the power supply voltage VDD and its drain coupled to output terminal 106. The output of second NAND gate NAND2 drives a gate of pull-up transistor P1. Pull-up transistor P1 will thus be off whenever the current binary symbol received on input data node 104 is a binary zero. Upon the transition to a current binary one symbol from a preceding binary zero symbol (a rising edge for the beginning of the current binary symbol), the output of second NAND gate NAND2 will immediately go low since this second NAND gate NAND2 will be processing two binary one inputs. Pull-up delay line 200 thus responds to the rising edge for the current binary symbol to begin charging output terminal 106 for the pull-up preemphasis period.

The cumulative delay across pull-up delay line 200 determines the duration of the pull-up preemphasis period. Prior to the rising edge for the current binary symbol (the beginning of the current binary symbol), the output of second NAND gate NAND2 and the output for first NAND gate NAND2 are both binary ones. Should the previous symbol transmission have been a binary zero the outputs from each of AND gates AND1, AND2, and AND3 will be a binary zero as well. If the current binary symbol is a transition to a binary one, the output of buffer 205 will go high after its processing delay such that the output of initial AND gate AND1 will also go high after its processing delay. In turn, the output of second AND gate AND2 will go high after its processing delay. Finally, the output of third AND gate AND3 will go high after its processing delay. It will be appreciated that other logic gates may be used in alternative embodiments. Moreover, the total number of logic gates in pull-up delay line depends upon the desired length to the resulting pull-up preemphasis period.

The output of initial NAND gate NAND1 will drop to a binary zero after the processing delays through the preceding logic gates in pull-up delay line 200. This binary zero output from first NAND gate NAND1 causes second NAND gate NAND2 to drive its output to a binary one so as to switch off pull-up transistor P1. The processing delay through buffer 205, first AND gate AND1, second AND gate AND2, third AND gate AND3, initial NAND gate NAND1, and second NAND gate NAND2 thus determines the pull-up preemphasis period for pull-up delay line 200 (ignoring the turn on delay for pull-up transistor P1). As discussed previously, the duration of the pull-up preemphasis period should match the expected reflection time delay from the transmission of the preceding binary symbol. The number of logic gates in pull-up delay line 200 may thus be varied so that the desired pull-up preemphasis period is achieved. In alternative embodiments, some logic gates in pull-up delay line 200 may be selectively activated or deactivated to provide a tuning ability for the pull-up preemphasis period.

Depending upon the data rate for the binary symbols transmitted by transmitter 100 (FIG. 1), the pull-up preemphasis period may be greater than or less than the symbol period (unit interval) for each transmitted binary symbol. Should the pull-up preemphasis period be less than the unit interval, the pull-up through pull-up transistor P1 will be terminated prior to the complete transmission of the current binary symbol. In such a case, the pull-up can never interfere with a subsequent binary zero symbol transmission. However, even if the pull-up preemphasis period is designed to be less than the unit interval, process, voltage, and temperature variations may cause the pull-up preemphasis period to exceed the unit interval. Moreover, as the data rate is increased, it becomes more likely that the pull-up preemphasis period will extend beyond the unit interval. Should the subsequent binary symbol still be a binary one, the resulting extended pull-up does not interfere with the subsequent binary symbol transmission. But this extended pull-up would interfere with a subsequent transmission of a binary zero symbol. But since the two-input logic gates in pull-up delay line 200 all receive the current data symbol, such a subsequent binary zero symbol causes the output of first NAND gate NAND1 and second NAND gate NAND2 to both rise to a binary one such that PMOS transistor P1 is switched off. In addition, the outputs of first AND gate AND1, second AND gate AND2, and third AND gate AND3 will all drop to zero. Pull-up delay line 200 thus resets in response to the zero bit transmission so as to terminate the pull-up preemphasis period.

The pull-up preemphasis period may thus be considered to be a variable preemphasis period should the desired delay across pull-up delay line 200 exceed the unit interval because the resulting pull-up preemphasis period is cut short at the unit interval in response to a zero bit following the binary one bit that triggered the pull-up. Pull-up delay line 200 may thus be deemed to form a first means for switching on the pull-up transistor P1 for a first variable preemphasis period in response to output driver 102 beginning to drive a first one of the binary symbols that is a complement of an immediately preceding one of the binary symbols to the first binary symbol; wherein the first means is configured to terminate the first variable preemphasis period at a delay greater than the symbol period in response to an immediately subsequent one of the binary symbols following the first binary symbol being equal to the first binary symbol, and wherein the first means is further configured to terminate the first variable preemphasis period at a delay equaling the symbol period in response to the immediately subsequent binary symbol being the complement of the first binary symbol.

The operation of one-shot pull-down circuit 120 is analogous. In that regard, one-shot pull-down circuit 120 includes a pull-down delay line 215 that controls the on and off state of a pull-down NMOS transistor M1 having its source coupled to ground and its drain coupled to output terminal 106. Pull-down delay line 215 ends in a first NOR gate NOR1 that drives a second NOR gate NOR2. The output of second NOR gate NO2 drives the gate of pull-down transistor M1. Both the first NOR gate NOR1 and the second NOR gate NOR2 also receive the current binary symbol as an input (both have an input coupled to input data node 104). In response to the preceding binary one symbol, the output for both the first NOR gate and the second NOR gate will be zero. When output driver 102 then drives a binary zero symbol, second NOR gate NO2 will be processing two binary zero inputs such that it drives the gate of transistor M1 to the power supply voltage VDD (all the logic gates in both pull-up delay line 200 and pull-down delay line 215 are powered by the power supply voltage VDD). The transition to the current binary zero symbol thus switches on pull-down transistor M1 to assist the discharge of output terminal 106 for a pull-down preemphasis period.

Pull-down delay line 215 begins with a buffer 205 that drives an input of a first OR gate OR1, that in turn drives an input of second OR gate OR2. Second OR gate OR2 drives an input of a third OR gate OR3. All these OR gates receive the current binary symbol as an input as well by coupling to input data node 104. During the previous transmission of the binary one symbol, the outputs of the OR gates are all binary high. In response to the falling edge for the current binary zero symbol, the output of first OR gate OR1 will go to zero, followed by the output of second OR gate OR2 dropping low, and then the output of third OR gate OR3 dropping low. Third OR gate OR3 drives an input of first NOR gate NOR1. When the output of OR gate OR3 drops low, the output of first NOR gate NOR1 goes high to in turn cause the output of second NOR gate to drop low. The cumulative processing delay through the logic gates in pull-down delay line 215 thus determines the duration of the pull-down preemphasis period. The duration of the pull-down preemphasis period matches the expected reflection time for the reflection of the preceding binary symbol transmission so that the falling edge preemphasis counters the effects of such reflections. The number of logic gates in pull-down delay line 215 may be varied such that the appropriate delay is achieved. Should the subsequent binary symbol transmission be a binary one symbol, this binary one input is received by second NOR gate NOR2 such that its output goes low to switch off transistor M1. The pull-down preemphasis period is thus also a variable preemphasis period should the desired duration of the pull-down preemphasis period exceed the unit interval. Pull-down delay line 215 may thus be deemed to comprise a second means for switching on the pull-down transistor M1 for a second variable preemphasis period in response to output driver 102 beginning to drive a second one of the binary symbols that is a complement of an immediately preceding one of the binary symbols to the second binary symbol, wherein the second means is configured to terminate the second variable preemphasis period at a delay greater than the symbol period in response to an immediately subsequent one of the binary symbols following the second binary symbol being equal to the second binary symbol, and wherein the second means is further configured to terminate the second variable preemphasis period at a delay equaling the symbol period in response to the immediately subsequent binary symbol being the complement of the second binary symbol.

Figure 3:
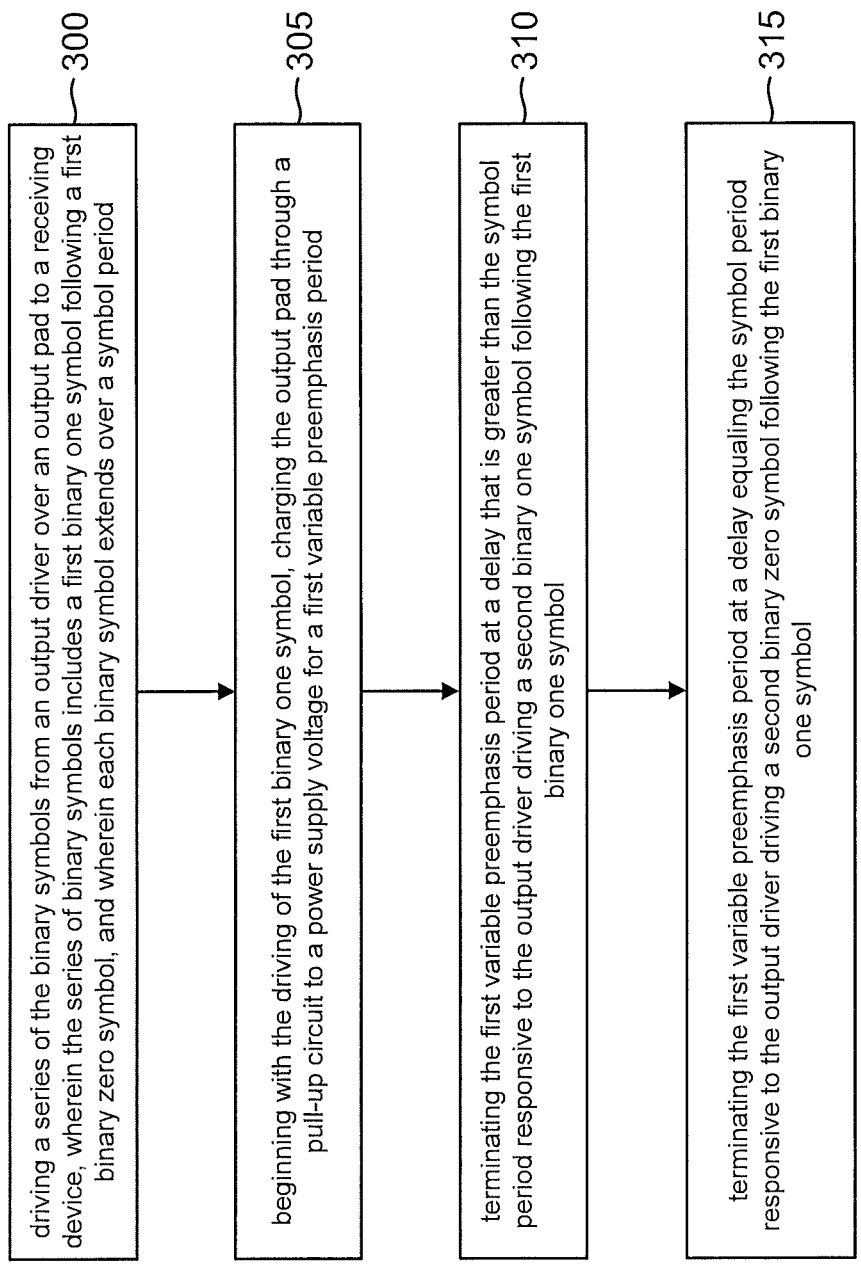
FIG. 3 is a flowchart for a method of providing an un-clocked delay line and one-shot pre-emphasis of a data signal, in accordance with an embodiment.

A method of operation for an example transmitter will now be discussed with regard to the flowchart of FIG. 3. The method begins with an act 300 of driving a series of the binary symbols from an output driver over an output terminal to a receiving device, wherein the series of binary symbols includes a first binary one symbol following a first binary zero symbol, and wherein each binary symbol extends over a symbol period. The driving of a series of binary symbols by output driver 102 over output terminal 106 is an example of act 300.

The method also includes an act 305 of, beginning with the driving of the first binary one symbol, charging the output terminal through a pull-up circuit to a power supply voltage for a first variable preemphasis period. The switching on of pull-up transistor P1 by pull-up delay line 200 is an example of act 305.

The method also includes an act 310 of terminating the first variable preemphasis period at a delay that is greater than the symbol period responsive to the output driver driving a second binary one symbol following the first binary one symbol. The transmission of a triggering binary one symbol followed by another binary one symbol with regard to the eventual reset of pull-up delay line 200 is an example of act 310.

Finally, the method includes an act 315 of terminating the first variable preemphasis period at a delay equaling the symbol period responsive to the output driver driving a second binary zero symbol following the first binary one symbol. The switching off of pull-up transistor P1 in response to a binary zero symbol transmission is an example of act 315.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transmitter, comprising:
an output driver configured to drive a series of binary symbols over an output terminal, wherein each binary symbol extends over a symbol interval; and
a one shot pull-up circuit configured to charge the output terminal to a power supply voltage for a preemphasis period in response to a current one of the binary symbols being a binary one symbol having a rising edge, wherein the preemphasis period extends into the symbol interval for a subsequent one of the binary symbols in response to the subsequent binary symbol being a binary one symbol, and wherein the preemphasis period does not extend into the symbol interval for the subsequent binary symbol in response to the subsequent binary symbol being a binary zero symbol.

2. The transmitter of claim 1, wherein the one shot pull-up circuit includes:
a pull-up transistor coupled between a power supply node supplying the power supply voltage and the output terminal; and
a pull-up delay line configured to switch on the pull-up transistor in response to a rising edge of the current binary symbol and to switch off the pull-up transistor upon the termination of the preemphasis period.

3. The transmitter of claim 2, wherein the pull-up delay line comprises a plurality of logic gates arranged in series, and wherein a collective processing delay for the plurality of logic gates defines the preemphasis period.

4. The transmitter of claim 2, wherein the pull-up delay line includes a plurality of AND gates arranged in series, and wherein each AND gate in the plurality of AND gates has an input coupled to an input of the output driver.

5. The transmitter of claim 4, wherein the pull-up delay line further includes a buffer having an output coupled to an input of an initial one of the AND gates.

6. The transmitter of claim 2, the pull-up delay line further includes a plurality of NAND gates arranged in series from an initial NAND gate to a final NAND gate, and wherein each NAND gate in the plurality of NAND gates has an input coupled to an input of the output driver.

7. The transmitter of claim 6, wherein the pull-up delay line further includes a plurality of AND gates arranged in series from an initial AND gate to a final AND gate, and wherein the initial NAND gate is configured to receive an output from the final AND gate, and wherein the final NAND gate drives a gate of the pull-up transistor.

8. The transmitter of claim 7, wherein the pull-up transistor is a PMOS transistor.

9. The transmitter of claim 1, wherein the current binary symbol is a binary one symbol, and wherein the preceding binary symbol is a binary zero symbol.

10. A transmitter, comprising:
an output driver configured to drive a series of binary symbols over an output terminal, wherein each binary symbol extends over a symbol interval; and
a one shot pull-down circuit configured to ground the output terminal for a preemphasis period in response to a current one of the binary symbol being a binary zero symbol, wherein the preemphasis period extends into the symbol interval for a subsequent one of the binary symbols in response to the subsequent binary symbol being a binary zero symbol, and wherein the preemphasis period does not extend into the symbol interval for the subsequent binary symbol in response to the subsequent binary symbol being a binary one symbol.

11. The transmitter of claim 10, wherein the one shot pull-down circuit includes:
a pull-down transistor coupled between the output terminal and ground; and
a pull-down delay line configured to switch on the pull-down transistor in response to a falling edge of the current binary symbol and to switch off the pull-down transistor upon termination of the preemphasis period.

12. The transmitter of claim 11, wherein the pull-down delay line comprises a plurality of logic gates arranged in series, and wherein a collective processing delay for the plurality of logic gates defines the preemphasis period.

13. The transmitter of claim 11, wherein the pull-down delay line includes a plurality of OR gates arranged in series, and wherein each OR gate in the plurality of OR gates has an input coupled to an input of the output driver.

14. The transmitter of claim 13, wherein the pull-down delay line further includes a buffer having an output coupled to an input of an initial one of the OR gates.

15. The transmitter of claim 11, wherein the pull-down delay line includes a plurality of NOR gates arranged in series from an initial NOR gate to a final NOR gate, and wherein each NOR gate in the plurality of NOR gates has an input coupled to an input of the output driver.

16. The transmitter of claim 15, wherein the pull-down delay line includes a plurality of OR gates arranged in series, and wherein the initial NOR gate is configured to receive an output from a final one of the OR gates, and wherein the final NOR gate drives a gate of the pull-up transistor.

17. The transmitter of claim 11, wherein the pull-down transistor is an NMOS transistor.

18. The transmitter of claim 10, wherein the current binary symbol is a binary zero symbol, and wherein the preceding binary symbol is a binary one symbol.

19. A method of transmitting binary symbols, comprising:
driving a series of the binary symbols from an output driver over an output terminal to a receiving device, wherein the series of binary symbols includes a first binary one symbol following a first binary zero symbol, and wherein each binary symbol extends over a symbol period;
beginning with the driving of the first binary one symbol, charging the output terminal through a pull-up circuit to a power supply voltage for a first variable preemphasis period;
terminating the first variable preemphasis period at a delay that is greater than the symbol period responsive to the output driver driving a second binary one symbol following the first binary one symbol; and
terminating the first variable preemphasis period at a delay equaling the symbol period responsive to the output driver driving a second binary zero symbol following the first binary one symbol.

20. The method of claim 19, wherein the series of binary symbols includes a third binary zero symbol following a second binary one symbol, the method further comprising:
beginning with the driving of the third binary zero symbol, discharging the output terminal through a pull-down circuit for a second variable preemphasis period;
terminating the second variable preemphasis period at the delay that is greater than the symbol period responsive to the output driver driving a fourth binary zero symbol following the third binary one symbol; and
terminating the second variable preemphasis period at the delay equaling the symbol period responsive to the output driver driving a third binary one symbol following the third binary zero symbol.

21. The method of claim 20, further comprising determining the second variable preemphasis period with a pull-down delay line.

22. The method of claim 19, further comprising determining the first variable preemphasis period with a pull-up delay line.

23. A transmitter, comprising:
an output driver configured to drive a series of binary symbols over an output terminal, wherein each binary symbol extends over a symbol period;
a pull-up transistor coupled between a power supply node providing a power supply voltage and the output terminal; and
first means for switching on the pull-up transistor for a first variable preemphasis period in response to the output driver beginning to drive a first one of the binary symbols that is a complement of an immediately preceding binary symbol to the first binary symbol; wherein the first means is configured to terminate the first variable preemphasis period at a delay greater than the symbol period in response to an immediately subsequent binary symbol to the first binary symbol being equal to the first binary symbol, and wherein the first means is further configured to terminate the first variable preemphasis period at a delay equaling the symbol period in response to the immediately subsequent binary symbol to the first binary symbol being the complement of the first binary symbol.

24. The transmitter of claim 23, further comprising:
a pull-down transistor coupled between the output terminal and ground; and
second means for switching on the pull-down transistor for a second variable preemphasis period in response to the output driver beginning to drive a second one of the binary symbols that is a complement of an immediately preceding binary symbol to the second binary symbol, wherein the second means is configured to terminate the second variable preemphasis period at a delay greater than the symbol period in response to an immediately subsequent binary symbol to the second binary symbol being equal to the second binary symbol, and wherein the second means is further configured to terminate the second variable preemphasis period at a delay equaling the symbol period in response to the immediately subsequent binary symbol to the second binary symbol being the complement of the second binary symbol.

25. The transmitter of claim 24, wherein the pull-down transistor is an NMOS transistor.

26. The transmitter of claim 23, wherein the pull-up transistor is a PMOS transistor.

* * * * *